United States Patent
DiStefano

(10) Patent No.: US 7,752,738 B2
(45) Date of Patent: Jul. 13, 2010

(54) METHODS FOR FABRICATING THIN COMPLAINT SPRING CONTACTS

(75) Inventor: Thomas H. DiStefano, Monte Sereno, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1046 days.

(21) Appl. No.: 11/039,949

(22) Filed: Jan. 24, 2005

(65) Prior Publication Data

US 2006/0130319 A1 Jun. 22, 2006

Related U.S. Application Data

(60) Provisional application No. 60/636,614, filed on Dec. 17, 2004.

(51) Int. Cl.
*H01H 11/00* (2006.01)
*H01H 65/00* (2006.01)

(52) U.S. Cl. ............................ 29/622; 29/835; 29/838; 29/882; 257/E23.024; 257/E23.068; 257/E23.078; 438/117; 438/611

(58) Field of Classification Search ............... 29/622, 29/832, 835, 838, 846, 882; 257/E23.024, 257/E23.068, E23.078; 333/262; 438/117, 438/611
See application file for complete search history.

(56) References Cited

U.S. PATENT DOCUMENTS

| | | | |
|---|---|---|---|
| 4,716,049 A | 12/1987 | Patraw | |
| 4,902,606 A | 2/1990 | Patraw | |
| 4,924,353 A | 5/1990 | Patraw | |
| 5,171,718 A * | 12/1992 | Ishibashi et al. | ............ 438/571 |
| 5,870,007 A * | 2/1999 | Carr et al. | .................. 333/262 |
| 6,230,397 B1 | 5/2001 | Tighe | |
| D472,880 S | 4/2003 | Clements et al. | |
| 6,555,443 B1 * | 4/2003 | Artmann et al. | ............. 438/458 |
| D475,021 S | 5/2003 | Clements et al. | |
| 6,658,728 B2 * | 12/2003 | Fork et al. | ..................... 29/832 |
| 2006/0087064 A1 | 4/2006 | Daniel et al. | |

OTHER PUBLICATIONS

U.S. Appl. No. 10/997,931, filed Nov. 29, 2004, Fork et al.

* cited by examiner

*Primary Examiner*—Thiem Phan
(74) *Attorney, Agent, or Firm*—Oliff & Berridge, PLC

(57) ABSTRACT

Systems and methods are provided for fabricating compliant spring contacts for use in, for example, IC packaging and interconnection between multi-layers in stacked IC packages and electronic components. Internal stresses generated within an formed film are released to cause the film to buckle and/or bow away from a supporting terminal. A thin stressed metal film layer is selectively broken away from the substrate of the supporting terminal allowing the stressed metal film to take on a bowed and/or spring-like shaped through minute deformation based on a release of the internal stresses. The resultant thin compliant spring contact can deform a small amount as the spring contact is then pressed against a compatible mating contact surface in an overlying layer.

15 Claims, 3 Drawing Sheets

METHODS FOR FABRICATING THIN COMPLAINT SPRING CONTACTS

CLAIM OF PRIORITY

This application claims priority to U.S. Provisional Patent Application No. 60/636,614 filed on Dec. 17, 2004, the disclosure of which is incorporated herein in its entirety.

BACKGROUND

Various systems and methods are employed to provide inter-chip communication or inter-layer interconnection between multiple layers of, for example, IC circuit chips, in IC packaging. U.S. Pat. No. 4,924,353 to Patraw, incorporated herein in its entirety by reference, reviews, in detail, vast improvement made in the performance of electronic component throughout the electronics industry focusing ultimately on fabrication and further miniaturization of semi-conductor materials and devices and the concomitant packaging problem which such miniaturization brings. Difficulties arise from a number of sources including the fragile nature of the very light gauge wire often used for interconnection, as well as deformation issues which arise from introducing heat and/or stress, e.g., compressive stresses, during conventional fabrication processes. Such difficulties are only exacerbated when individual IC chips or wafers are stacked vertically and interconnection is required between the vertically stacked layers.

Patraw discloses a number of these systems and methods for overcoming the issues associated with inter-layer interconnection and further discusses the drawbacks associated with each. For example, inherent or induced non-planarity of individual chips or wafers may result in ineffective mating between such layers. Based on a non-planarity which may be characteristic of the substrates upon which integrated circuits are formed, it is recognized that elevated contacts with advantageously a characteristic "springiness" may facilitate communication between vertically stacked layers of integrated circuits. Such elevated contacts tend to overcome interconnection shortfalls which arise from characteristic or induced non-planarity in individual chips or wafers as well as environmental concerns, such as, for example, vibration induced in the vertically stacked integrated circuit when operated in its intended environment.

As a solution, Patraw discloses a body of conductive material formed as a pedestal having an upper portion and at least three legs which extend from the upper portion, the legs terminating in flare contact pads which are capable of securely mating to a substantially flat conductive pad in order to form a reliable electrical coupling. Specifically, Patraw explains that the pedestal is formed from a metal which is flexible and will provide an oppositely directed spring tension when the entire pedestal is subjected to a loading force that presses it against an interface pad.

SUMMARY

The fabrication process for the pedestal disclosed in Patraw is, however, complex and contains itself certain inherent shortfalls. Among these shortfalls are that it is difficult to apply a layer of photoresist in three dimensions, because typically a photolithographic process focuses light onto a plane and as such any component that is three-dimensional will be out of plane and thus not in focus, making it difficult to accomplish fine line photolithography at the level of detail required for the disclosed components. Additionally, extruding metal layers in order to fabricate three-dimensional structures therefrom is difficult given the frail and/or brittle nature of these fine layers often resulting in them being fractured, torn or otherwise broken.

Cost of fabrication is a primary concern in producing electronic components in high volume applications, such as the IC packaging and interconnect circuitry which may include spring contacts. Reducing manufacturing costs of individual components, particularly stressed metal components, may prove important to their success. As noted above, conventional fabrication methods, such as those disclosed in Patraw, are complex. Further, such techniques tend to introduce failures within the components during fabrication that reduce overall yield from high volume manufacturing processes.

Among other difficulties in many conventional applications are those associated with depositing thin film layers on substrates while attempting to control internal stresses within the deposited layers. Certain inherent internal stresses are introduced during most conventional deposition processes. A need to control these inherent internal stresses places added burden and requirements on the processes associated with fabrication of contacts. If process control is not maintained during the deposition of a thin metal film under conventional processes, product can be lost here as well due to yield loss, thus leading to additional cost of fabrication.

It would be advantageous to reduce costs and waste associated with fabrication of IC packages and interconnect components if the process of fabricating advantageously elevated contacts (referred to below and throughout as "thin compliant spring contacts") could be simplified. A method of fabricating stressed metal films with a reduced requirement for maintaining well-controlled stresses in multiple layers may result in a simplified manufacturing process for thin compliant spring contacts and lead to reduced costs. The systems and methods of exemplary embodiments disclosed herein seek to avoid drawbacks associated with fabrication of thin compliant spring contacts used in multi-layer IC structures or packages.

The systems and methods according to exemplary embodiments described herein may provide thin compliant spring contacts based on stressed metal films that do not require strict control of the deposition properties and processes of applying multi-layer films.

The systems and methods according to exemplary embodiments described herein may provide thin compliant spring contacts which are substantially spring components that span points of contact with a base terminal, and have an elevated portion extending away from the terminal in order to make contact with a compliant receptor or compatible mating contact surface in or associated with an overlying substrate. In one form, the thin compliant spring contact may be a single beam spanning two points of support on a substrate. More complex structures where the elevated portion of the thin compliant spring contact is supported one or more continuous or multiple discrete support points may also be provided.

The systems and methods according to exemplary embodiments described herein provide for the fabrication of a thin compliant spring contact which may advantageously employ the internal stresses generated within an electrodeposited thin stressed metal film to cause a portion of the film to buckle and/or bow away from a supporting substrate and/or terminal while other portions of the film remain affixed to the supporting substrate and/or terminal. Such buckling and/or bowing may be a naturally occurring byproduct of the deposition process itself, or may be alternatively facilitated by making use of an optionally applied underlying release layer that is deposited on the substrate prior to deposition of a thin stressed metal film. Such a release layer, if used, may be available to allow the thin stressed metal film to be selectively broken away from the substrate of the supporting terminal, thus allowing the thin stressed metal film to take on a bowed and/or spring-like shape through minute deformation through a release of the internal stresses.

With this slight deformation, exemplary thin compliant spring contacts can be pressed against a compliant receptor or compatible mating contact surface in an overlying substrate in order to complete layer-to-layer interconnection and to reduce the possibility of non-contact due to non-planarity of the individual substrates involved, or other adverse effects.

These and other features and advantages of the invention are described herein, or apparent from, the following detailed description of the various exemplary embodiments of the systems and methods for fabricating thin compliant spring contacts.

BRIEF DESCRIPTION OF THE DRAWINGS

Various exemplary embodiments of the systems and methods will be described in detail with reference to the accompanying figures, with like features having like reference numbers, wherein.

DETAILED DESCRIPTION OF EMBODIMENTS

Figure 1:
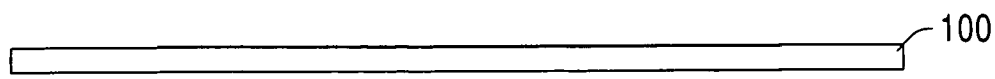
FIGS. 1-4 illustrate cross-sectional views of various steps in an exemplary process for fabricating an exemplary thin compliant spring contact.

The following description of various exemplary embodiments of the systems and methods for fabricating exemplary thin compliant spring contacts according to this invention may refer, as shown in FIGS. 1-6, to a single beam spring member spanning two points of support. Such an exemplary embodiment of a thin compliant spring contact, fabricated using the exemplary systems and methods described herein, is referred to for the sake of clarity, familiarity and ease of depiction and description. However, it should be appreciated that the principles applied to the exemplary embodiment as outlined and/or discussed below can be fully applied to any more complex elevated structure supported, for example, at least at (a) multiple discrete points of support, or (b) one or more continuous points of support capable of supporting such a thin compliant spring contact to, e.g., facilitate inter-layer interconnection such as, for example, in multi-layer IC packaging, as will be shown in various exemplary embodiments below.

It should be appreciated that the systems and methods for fabricating thin compliant spring contacts as will be detailed in the exemplary embodiments below are intended to reduce cost of fabrication of the electronic components within which these thin compliant spring contacts are installed. Such an objective may be substantially achieved by reducing the need to carefully control the fabricating environments in order to specifically reduce or eliminate internal stresses associated with conventional deposition processes for depositing thin film layers of stressed metal films on exemplary substrates.

In various exemplary embodiments of the systems and methods according to this invention, an exemplary method of fabricating thin compliant spring contacts may advantageously employ the internal stresses generated within an electrodeposited thin stressed metal film to selectively and controllably cause the film to buckle and/or bow away from a supporting substrate and/or terminal. An optional release layer may be applied to the supporting substrate or otherwise interposed between the thin stressed metal film and the supporting substrate and/or terminal. Such a release layer may allow a portion of the thin stressed metal film to selectively and controllably break away from the supporting substrate and/or terminal and to take a bowed shape while another portion of the this stressed metal film remains affixed to the supporting substrate and/or terminal as one or more support points for a fabricated thin compliant spring contact. The thin compliant spring contact can deform a small amount as the spring contact is then pressed against a compliant receptor or compatible mating contact surface.

An exemplary thin compliant spring contact provides a limited amount of compliance needed to compensate for small non-planarity of mating surfaces supporting electrical contact for, e.g., interconnection between layers in multi-layer interconnected micro-electronic devices. An example of an application of such contacts is in stacked IC packaging where electrical contacts on one layer in a package are pressed against compliant receptors or compatible mating contact surfaces on adjacent layers in the stack in a package arranged generally in a vertical stack. A small compliance of the spring accommodates slight imperfections and non-planarity between the two mating surfaces in order to substantially ensure good electrical contact between layers.

It should be appreciated that for ease of depiction and clarity, other components and detailed interconnection of those multiple components with an exemplary thin compliant spring contact on the surface of a single substrate has been omitted in the depictions and descriptions set forth below. Thin compliant spring contacts may be used in high frequency connections such as, for example, transmission lines. As such, in order to promote high performance, thin compliant spring contacts may be fabricated to be a portion of a continuous wire or circuit that may include, for example, compliant receptors or compatible mating contact surfaces above and below the thin compliant spring contacts. A challenge in the fabrication processes is to accommodate slight irregularities in thickness of incorporated materials, and characteristic or environmentally induced non-planarity of at least the substrate materials. Thin compliant spring contacts, therefore, should exhibit certain springiness and/or flexibility in order that their compliance may bridge across mechanical imperfections promoting contact between stacked layers even across surfaces that are not precisely planar.

FIGS. 1-4 illustrate cross-sectional views of various steps in an exemplary process for fabricating an exemplary thin compliant spring contact.

Figure 2:

As shown in FIG. 1, a supporting substrate 100 (also referred to as a supporting terminal) is provided. In FIG. 2, a release layer 110 is optionally selectively applied to at least a portion of the supporting substrate 100. Such a release layer 110 may comprise any material that facilitates release of a thin stressed metal film selectively deposited on the substrate such as a material that releases adhesion at a set temperature or on exposure to light, the latter requiring a light transmissible substrate. The material of the release layer 110 may be patterned by simple, low cost conventional methods of application such as stencil printing, screen printing, inkjet deposition or other effective printing processes.

Figure 3:
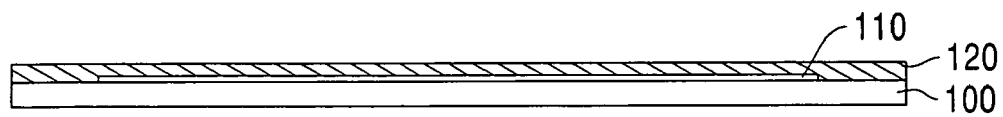

As shown in FIG. 3, a layer of thin stressed metal film 120 is applied to, or deposited on, the supporting substrate 100 and release layer 110 combination. In the exemplary process shown, positive contact between a portion of the thin stressed metal film 120 and the supporting substrate 100 is maintained at one or more points of contact that lie outside an area of the supporting substrate 100 that is covered by the release layer 110.

The thin stressed metal film 120 may be deposited directly onto the supporting substrate 100, or the combination of the supporting substrate 100 and optional release layer 110, by any commonly known process such as, for example, sputter deposition, electro-deposition (electroplating), vacuum deposition or other effective process for depositing a thin stressed metal film on a substrate.

It should be appreciated that, in conventional electroplating and/or sputtering processes, internal compressive stresses in thin metal film layers 120 are sought to be minimized through the use of carefully or highly controlled processing environments. In such conventional plating and/or sputtering processes, the development of internal compressive stresses is a disadvantage. Specifically, once a surface is plated or sputter processed, it is generally considered disadvantageous for the deposited film to then expand. Such expansion as may naturally occur in the release of internal stresses leads to cracking and/or deformation of deposited thin metal film layers, an outcome which is generally considered undesirable. It is an object of exemplary methods disclosed herein, however, to undertake the deposition step in such a manner to take advantage of these conventionally "unfavorable" compressive stresses. In other words, stresses are a necessary and desirable part of the exemplary fabrication methods described herein.

Figure 4:
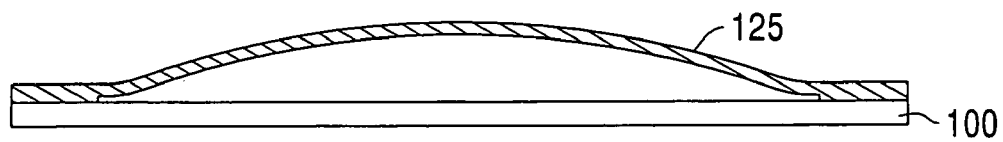

In various exemplary embodiments of the systems and methods according to this invention, thin compliant spring contacts are fabricated from this stressed metal film layers deposited in a state of compressive stress by any one of the above enumerated processes, or any other effective known or later-developed process. As such, once the thin stressed metal film 120 is applied, as shown in FIG. 3, an exemplary thin compliant spring contact 125 may be formed as shown in FIG. 4 as the compressive stresses are allowed to naturally release. Such formation may be facilitated by activating the optionally applied release layer 110 of FIGS. 2 and 3 in any manner which facilitates the release of such release layer 110. Such release may be facilitated by, for example, heating the structure to release a heat activated adhesion thus allowing the exemplary thin compliant spring contact 125 to buckle and bow outward as is shown in exemplary manner in FIG. 1D. It should also be appreciated that exemplary embodiments may employ a release layer that is always in a releasing state and may therefore not require activation. It should be further appreciated, however, that such a layer that is always in a releasing state would be a non-adhering layer that may make deposition on the layer difficult. Such a structure would, for example, be better facilitated if an unstressed layer were first laid onto the non-adhering layer in a way that kept the film in place. Then a stressed layer deposited onto the first metal layer would cause the film to distort away from the non-adhering layer on the substrate.

The process of fabricating simple metal stripes under stress is known in the art of electroplating and such stresses are often an unintended and generally undesired result of the plating process. In exemplary embodiments according to this invention, as discussed above, the intent is to fabricate the thin compliant spring contact 125 by intentionally depositing the thin stressed metal film 120 of FIG. 3 in a state in which compressive stress will be distributed throughout the film, preferably such that the stress is substantially uniform throughout the thickness of the film. In such an exemplary structure, completely uniform control of compressive stresses throughout the thickness of the film are, however, not critical to the fabrication and/or operation of the thin compliant spring contact 125.

It should be appreciated that compressive stresses can be generated at relatively high levels by conducting electroplating, and/or other deposition processes, under certain conditions that are less formally controlled than in conventional processes. Compressive stresses can be built into the metal films by adjusting any of a number of plating or deposition conditions, such as, for example, introducing impurity metal ions in order to control plating rates. It should be appreciated in the example of nickel that compressive stresses are understood to increase as plating rates are increased above a critical value.

Figure 5:
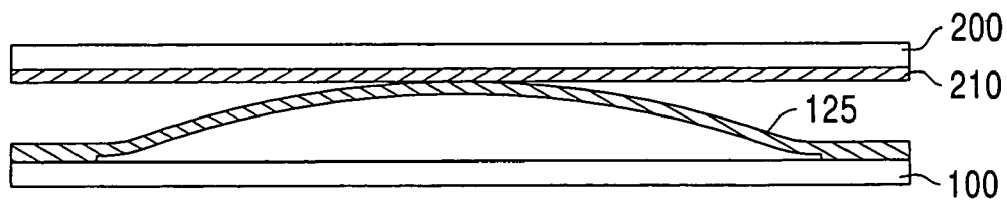
FIG. 5 illustrates an exemplary embodiment of a thin compliant spring contact, in use providing layer-to-layer interconnection when brought into contact with a compliant receptor or compatible mating contact surface in an overlying layer.

FIG. 5 illustrates an exemplary embodiment of a thin compliant spring contact 125, in use providing layer-to-layer interconnection when brought into contact with a compliant receptor or compatible mating contact surface 210 in an overlying layer 200. As shown in FIG. 2, the thin compliant spring contact 125 is attached to the supporting substrate 100. In operation then, the compliant mating contact surface 210 of an overlying substrate 200 is brought into surface contact with the thin compliant spring contact 125. The thin compliant spring contact 125 can then be deformed a small amount as the thin compliant spring contact 125 is mated to the compliant mating contact surface 210 to help ensure adequate electrical interconnection between layers.

In various exemplary embodiments of the systems and methods according to this invention, patterning of the thin stressed metal film 120 of FIG. 3 in order to achieve a desired shape in the thus fabricated thin compliant spring contact 125 of FIGS. 4 and 5 may occur in any of a number of conventional ways. For example, prior to depositing the thin stressed metal film 120 on the supporting substrate 100, or on the combination of supporting substrate 100 and optional release layer 110, the surface of the supporting substrate 100 may be masked. The thin stressed metal film 120 is then applied and the mask subsequently removed at any point after the deposition process is complete leaving the thin stressed metal film 120 patterned on the supporting substrate 100, as is desired to shape the resulting fabricated thin compliant spring contact. Alternatively, the entire surface of the supporting substrate 100 and optional release layer 110 may be covered with the thin stressed metal film 120 and the thin stressed metal film 120 may then be patterned by etching away unneeded areas according to any conventional etching process, such as, for example, a lithographic process such as, but not limited to, photolithography. Once the thin stressed metal film 120 is formed and/or patterned as desired, the optionally applied release layer 110 may, either naturally or after being activated, if activation is required, allow the thin compliant spring contact 125 to form upwardly by relieving internal stresses in the thin stressed metal film 120.

Figure 6:
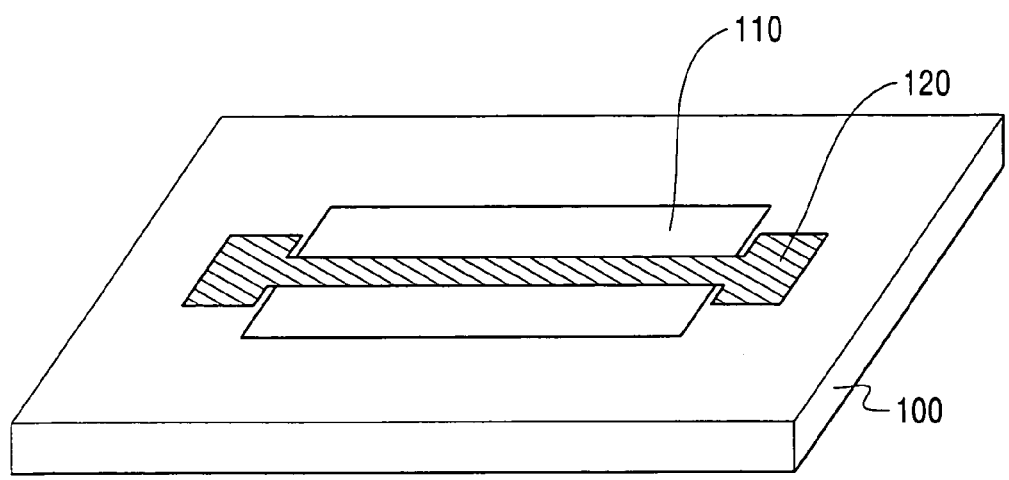
FIG. 6 illustrates a perspective view of a pre-released configuration of a first embodiment of an exemplary patterned thin stressed metal film, for fabricating an exemplary thin compliant spring contact, deposited on a substrate.

FIG. 6 illustrates a perspective view of a pre-released configuration of a first embodiment of an exemplary patterned thin stressed metal film 120, for fabricating an exemplary thin compliant spring contact, deposited on a substrate. As shown in FIG. 6, the thin stressed metal film 120 is deposited on the supporting substrate 100 in such a manner that it substantially spans any optionally applied release layer 110 that has been selectively applied to a portion of the surface of the supporting substrate 100. The exemplary thin stressed metal film 120 has been patterned by any of the methods disclosed above, e.g., masking and/or etching in order to form a final single bar span as the exemplary thin compliant spring contact. FIG. 6 depicts the structure essentially at the point in the process which is shown in FIG. 3.

Figure 7:
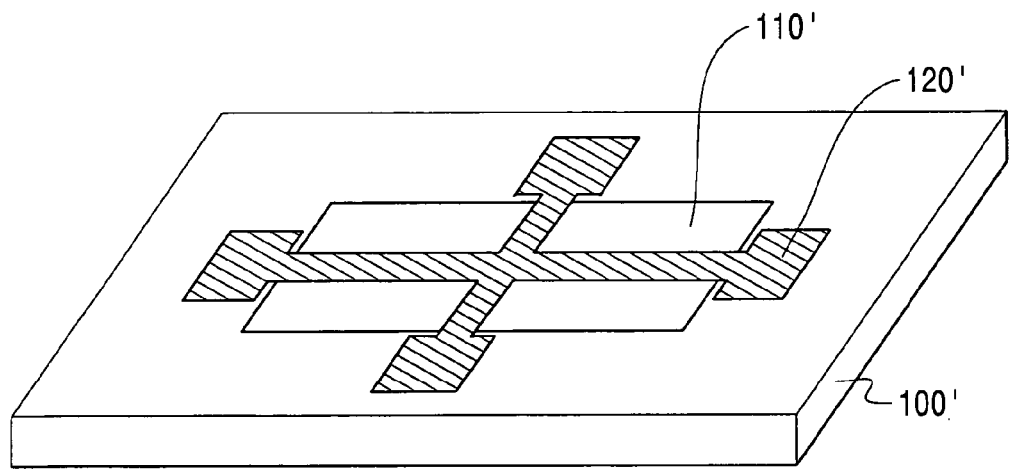
FIG. 7 illustrates a perspective view of a pre-released configuration of a second embodiment of an exemplary patterned thin stressed metal film, for fabricating an exemplary thin compliant spring contact, deposited on a substrate.

FIG. 7 illustrates a perspective view of a pre-released configuration of a second embodiment of an exemplary patterned thin stressed metal film 120', for fabricating an exemplary thin compliant spring contact, deposited on a substrate. As shown in FIG. 7, the exemplary thin stressed metal film 120' can be patterned in any manner of simple or complex or intricate design which provides, for example, multiple discrete points of contact between the thin stressed metal film 120' and the supporting substrate 100'. In such an exemplary embodiment, when release of the compressive stresses occur either through activation of the exemplary release layer 110' or otherwise, the resultantly fabricated thin compliant spring contact will remain affixed to the supporting substrate 100' at a plurality of discrete contact points.

Figure 8:
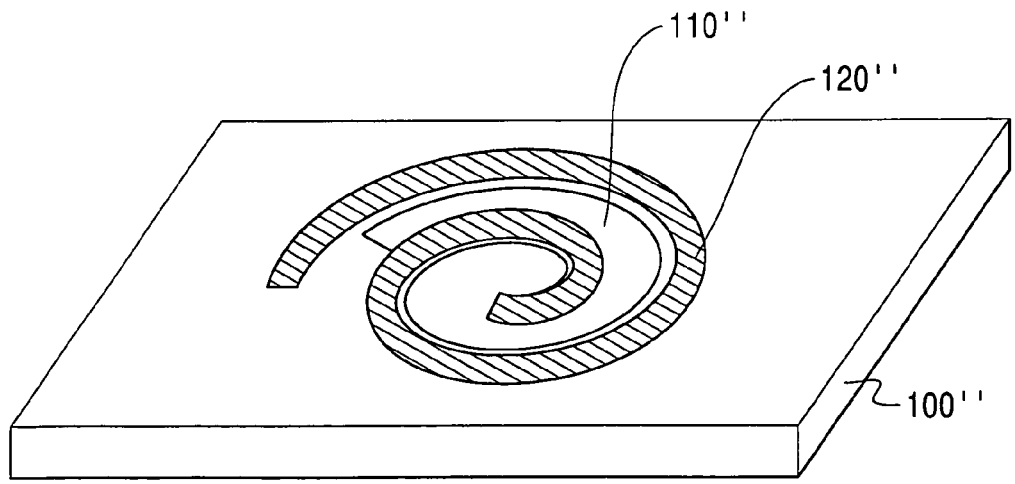
FIG. 8 illustrates a perspective view of a pre-released configuration of a third embodiment of an exemplary patterned thin stressed metal film, for fabricating an exemplary thin film compliant spring contact, deposited on a substrate.

FIG. 8 illustrates a perspective view of a pre-released configuration of a third embodiment of an exemplary patterned thin stressed metal film 120", for fabricating an exemplary thin film compliant spring contact, deposited on a substrate. As shown in FIG. 8, patterning of the exemplary thin stress metal film 120" is not limited to designs where contact between the thin stressed metal film 120" and the supporting substrate 100" is provided only at a set of discrete points as shown in FIGS. 6 and 7. Rather, in the exemplary embodiment shown in FIG. 8, a continuous contact area is provided for the thin stressed metal film 120" to be in contact with the supporting substrate 100" in order that substantial enough support is provided once release of the compressive stresses occurs. The rest of the pattern portion of the thin stressed metal film 120" appears as a spiral or coil overlying the exemplary optional release layer 110". As such, when the release layer 110' releases the compressive stresses in the thin stressed metal film 120", the ensuing thin compliant spring contact may take the shape of a small coil spring.

Figure 9:
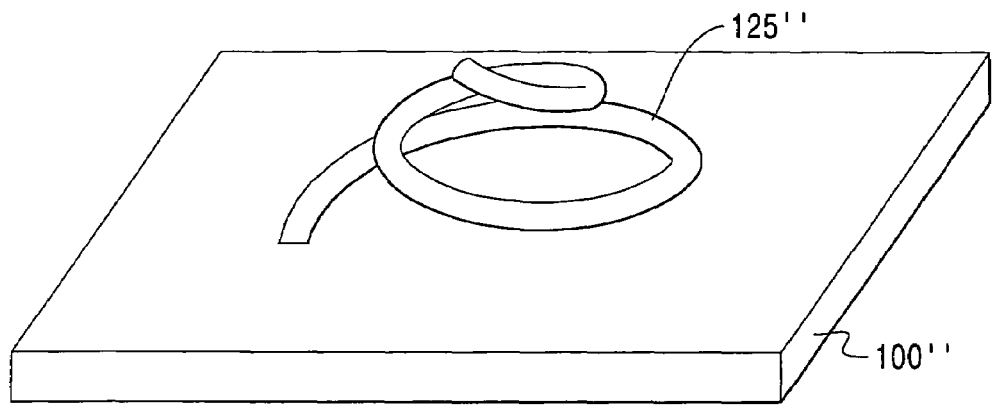
FIGS. 9-11 illustrate a series of detailed perspective views of an exemplary thin compliant spring contact fabricated from the patterned thin stressed metal film of FIG. 8.
Figure 10:
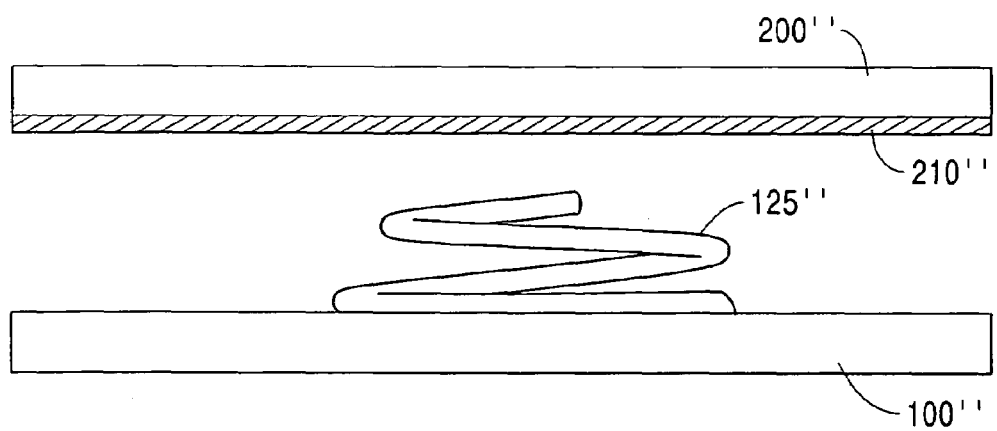
Figure 11:
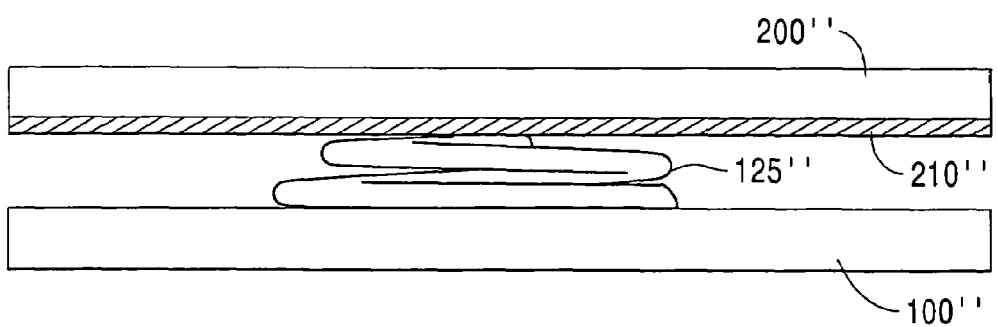

FIGS. 9-11 illustrate a series of detailed perspective views of an exemplary thin compliant spring contact 125" fabricated from the stressed metal film 120" of FIG. 8. FIG. 9 illustrates the exemplary thin compliant spring contact 125" fabricated when release of the thin stressed metal film 120" depicted in FIG. 8 has occurred. FIGS. 10 and 11 illustrate detail like that shown in FIG. 2 regarding mating of the thin compliant spring contact 125" to compliant receptor or compatible mating contact surface 210" of the overlying substrate 200" thereby completing the electrical contact and/or interconnection between multiple layers as is intended to be effected by the exemplary thin compliant spring contacts discussed herein.

It should be appreciated that an exemplary embodiment is contemplated where an entire circumferential portion or periphery of a this stressed metal film deposited on a supporting substrate remains affixed to the supporting substrate upon release of the compressive stresses. The central portion of such a thin stressed metal film would break away and bow away from the supporting substrate. As such, the resulting thin complains spring contact may resemble a small circular mound.

The exemplary embodiments outlined and as described above, are intended to be illustrative, not limiting. Various alternatives, modifications, variations and improvements may be made without departing from the spirit and scope of the invention.

What is claimed is:

1. A method for fabricating a compliant spring contact, comprising:

depositing a metal film on a substrate such that a first portion of the metal film is affixed to the substrate and a second portion of the metal film is not affixed to the substrate, wherein the depositing comprises electroplating in a manner that requires compressive stress to occur in the metal film to create in the metal film a tendency to deflect outward from the substrate by having a plating rate sufficiently high, the plating rate being increased by introducing impurities; and allowing the second portion of the metal film to deflect outwardly from the substrate when the compressive stress is released while ensuring that the first portion of the metal film remains affixed to the substrate.

2. The method of claim 1, wherein the compressive stress in the second portion is released substantially simultaneously with the depositing.

3. The method according to claim 1, further comprising applying a release layer to a portion of the substrate to which the second portion of the metal film is to be applied prior to depositing the metal film; and activating the release layer as the compressive stress in the metal film is released.

4. The method of claim 3, wherein the release layer is temperature activated and the release layer is activated by heating.

5. The method of claim 3, wherein the release layer comprises a light activated release layer and the release layer is activated by exposure to light.

6. The method of claim 1, wherein the depositing comprises electroplating or electro-deposition.

7. The method of claim 1, wherein the depositing comprises sputter deposition.

8. The method of claim 1, wherein the depositing comprises vacuum deposition.

9. The method of claim 1, further comprising patterning the metal film.

10. The method of claim 9, wherein patterning the metal film comprises:

masking the substrate prior to depositing the metal film; and removing the mask after depositing the metal film.

11. The method of claim 9, wherein patterning the metal film comprises etching the metal film after the metal film has been deposited on the substrate.

12. The method of claim 9, wherein the patterning comprises photolithography.

13. The method of claim 9, wherein the patterning results in the first portion of the metal film being a plurality of discrete contact points.

14. The method of claim 9, wherein the patterning results in the first portion of the metal film being a single substantially continuous support portion sufficient to support the fabricated thin compliant spring in operation.

15. A method, comprising:

depositing a metal film on a substrate such that a first portion of the metal film is affixed to the substrate and a second portion of the metal film is not affixed to the substrate, wherein the depositing comprises electroplating in a manner that requires compressive stress to occur in the metal film to create in the metal film a tendency to deflect outward from the substrate by having a plating rate sufficiently high, the plating rate being increased by introducing impurities;

allowing the second portion of the metal film to deflect outwardly from the substrate when the compressive stress is released while ensuring that the first portion of the metal film remains affixed to the substrate; and installing the metal film and substrate in an environment that uses the deflected metal film as a point of contact between electrical components.

* * * * *